US005628926A

United States Patent [19]
Belgacem et al.

[11] Patent Number: 5,628,926
[45] Date of Patent: May 13, 1997

[54] METHOD OF FORMING VIA HOLES IN A INSULATION FILM AND METHOD OF CUTTING THE INSULATION FILM

[75] Inventors: Haba Belgacem; Yukio Morishige, both of Tokyo, Japan

[73] Assignee: NEC Corporation, Tokyo, Japan

[21] Appl. No.: 364,451

[22] Filed: Dec. 27, 1994

[30] Foreign Application Priority Data

Dec. 28, 1993 [JP] Japan ................... 5-337939
Mar. 22, 1994 [JP] Japan ................... 6-050837
Jul. 26, 1994 [JP] Japan ................... 6-174413

[51] Int. Cl.$^6$ ................................ B23K 26/00
[52] U.S. Cl. ............... 219/121.71; 134/1.3; 438/759; 438/940
[58] Field of Search ............... 219/121.72, 121.71; 216/65; 156/644.1; 427/554; 134/1, 1.3; 437/195, 173, 203

[56] References Cited

U.S. PATENT DOCUMENTS

| | | | |
|---|---|---|---|
| 4,764,485 | 8/1988 | Loughran et al. | 437/203 |
| 4,961,259 | 10/1990 | Schreiber | 219/121.68 |
| 5,169,678 | 12/1992 | Cole et al. | 219/121.71 |
| 5,233,157 | 8/1993 | Schreiber et al. | 219/121.68 |
| 5,302,547 | 4/1994 | Wojnarowski et al. | 437/173 |
| 5,316,803 | 5/1994 | White, Jr. et al. | 427/554 |
| 5,386,430 | 1/1995 | Yamagishi et al. | 219/121.71 |

FOREIGN PATENT DOCUMENTS 2-104483  4/1990  Japan ................... 219/121.71

OTHER PUBLICATIONS

Srinivasan, R. et al., "Self–developing photoetching of poly (ethylene terephthalate) films by far–ultraviolet excimer laser radiation", *Applied Physics Letter*, vol. 41, No. 6, 15 Sep. 1982, pp. 576–578

*Primary Examiner*—Geoffrey S. Evans
*Attorney, Agent, or Firm*—Young & Thompson

[57] ABSTRACT

A method of forming via holes in an organic insulation film or cutting the film includes the steps of exposing predetermined parts of the film to a laser beam to raise a temperature of the exposed parts of the film until the exposed parts are transformed or decomposed and subjecting the film to an ultra sonic wave so that the transformed or decomposed parts are dispersed.

38 Claims, 4 Drawing Sheets

METHOD OF FORMING VIA HOLES IN A INSULATION FILM AND METHOD OF CUTTING THE INSULATION FILM

BACKGROUND OF THE INVENTION

The invention relates to a method of forming via holes in an insulation film including organic polymers to be used as a substrate for high density multilevel interconnections as well as a method of cutting the insulation film in various desired patterns.

The multilevel interconnection techniques may permit an improvement of a high density packaging of large scale integrated circuits for computers. One of the important issues regarding integrated circuit packaging techniques is to reduce the manufacturing cost as well as to place the high density packaging technique in a practical use. The insulation film used for the high density packaging of the integrated circuits are required to be made of such materials as to permit the integrated circuits to show high frequency performances. TEFLON® resin, polyimide synthetic resin polymer, and glass epoxy resin are available for the insulation film material wherein the insulation film material may include silica.

In the prior art, the via holes are formed in a glass epoxy resin substrate by use of mechanical drills. Further it has been known in the art that to form the via holes in the organic film photo-etching of polymer films by far-ultraviolet excimer laser radiation is available, which is disclosed in Applied Physics Letter 41(6) 15, Sep. 1982, pp. 576–578. In the prior art for cutting the glass epoxy resin substrate, is has been known to use various mechanical cutter. To cut the organic films, it has been known to use carbon dioxide gas laser radiations to cause a melting of the organic film and subsequent evaporation thereof.

The above method of forming the via hole by use of the mechanical drill has the disadvantage described below. A time of 0.1 seconds is needed to form a single via hole in the glass epoxy resin substrate. As a result, a formation of 2000 of via holes in the 20 cm-squared substrate requires about 3 minutes. This provides a limitation in throughput thereby resulting in a difficulty in reduction of the manufacturing cost. When forming the via hole in the TEFLON® synthetic resin polymer film suitable for high frequency performance of the device but having poor thermal and mechanical property, it is required that a rotation speed and a feeding speed of the drill are slow. In use of the mechanical drill, a minimum diameter of the via hole is relatively large for example 200 micrometers.

The above method of use of the photo-etching of polymer films by far-ultraviolet excimer laser radiation also has the disadvantages described below. This method may permit forming a fine via hole having a diameter of a few micrometers. Notwithstanding, in use of this laser radiation, a maximum processing speed is 0.1 micrometers/pulse. When using the commercially available excimer laser of 100 Hz, about 2 seconds are needed to form only a single via hole in a thin insulation film having a thickness of 20 micrometers. Even if one shot laser radiation may form a plurality of via holes, then the processing speed to form the via hole in the 20 cm-squared printed board is ⅕ times of the processing speed in use of the mechanical drill thereby resulting in a difficulty in improvement in the throughput. Further, this laser radiation method is available to only a film that shows a high absorption property of the laser beam. The XeCl excimer laser or KrF excimer laser are not available to the Glass epoxy resin film and the TEFLON® synthetic resin polymer film. The excimer laser uses halogen gases such as fluorine or chlorine. This results in a high cost of the laser device or a high maintenance cost.

The above conventional method for cutting the film by use of the mechanical cutter also has a disadvantage in that the cutting edge of the film has a flash and a chamber. Further, a cutoff area of 300 micrometers is needed.

The use of the carbon dioxide gas laser to cut the film also has a disadvantage in that a thermal transformation caused by the laser radiation remains at the cutting edge of the film because the cutting edge is subjected to a higher temperature than a melting point of the film.

SUMMARY OF THE INVENTION

Accordingly, it is an object of the present invention to provide a novel method of forming via holes in an organic insulation film free from any disadvantages as described above.

It is another object of the resent invention to provide a novel method of cutting an organic insulation film free from any of the disadvantages described above.

The above and other objects, features and advantages of the present invention will be apparent from the following descriptions.

The invention provides a novel method of forming via holes in an organic insulation film wherein predetermined parts of the organic insulation film are selectively exposed to a laser radiation to cause a thermal transformation or a thermal decomposition of the exposed parts thereof for subsequent ultrasonic cleaning of the film.

The invention also provides a novel method of cutting an organic insulation film wherein predetermined parts of the organic insulation film are selectively exposed to a laser radiation to cause a thermal transformation or a thermal decomposition of the exposed parts thereof for subsequent ultrasonic cleaning of the film.

BRIEF DESCRIPTIONS OF THE DRAWINGS

Preferred embodiments of the present invention will hereinafter be described in detail with reference to the accompanying drawings.

DESCRIPTION OF THE PREFERRED EMBODIMENTS

The invention provides a novel method of forming via holes in an organic insulation film wherein predetermined parts of the organic insulation film are selectively exposed to a laser radiation to cause a thermal transformation or a thermal decomposition of the exposed parts thereof for subsequent ultrasonic cleaning of the film.

The laser beam is irradiated on a predetermined part of the organic insulation film to cause a transformation of the predetermined part of the organic insulation film or to cause a thermal decomposition thereof. Subsequently, the ultra sonic cleaning of the film is carried out. It is preferable that the insulation organic film has a high absorptivity to the laser beam. If the absorptivity of the organic insulation film is not so high, then it is preferable to provide an absorption film having a high absorptivity to the laser beam on the organic insulation film so that the laser beam is sufficiently absorbed by the absorption film to cause the transformation or the thermal decomposition of the predetermined part of the organic insulation film. The absorption film has a thickness of 0.1 micrometers. A weak laser beam radiation on the absorption film is carried out for a short time of 1 microsecond to 100 milliseconds to raise a temperature of the absorption film thereby the transformation or the thermal decomposition is caused at part of the organic insulation film under the exposed part of the absorption film. The organic insulation film is subjected to the ultra sonic cleaning to cause dispersions in a liquid of the base material of the organic insulation film and the filler material to thereby form a via hole in the organic insulation film.

Immediately after the laser beam radiation, the film was observed by an electron microscope so that it was confirmed that the absorption film is lost while the organic insulation film remains as a film with a homology being somewhat varied. As a result, it was appreciated that the laser beam radiation may render an atomic bonding weak between the base material and the filler material thereby the transformation or the thermal decomposition is caused in the organic insulation film wherein the transformed part thereof has a fine definition. The transformed part of the organic insulation film is subjected to the strong ultra sonic vibration to be dispersed to thereby form a via hole having a fine definition.

If the organic insulation film has such an absorptivity that 20% or more of the laser beam may be absorbed in the organic insulation film, then the organic insulation film having the organic base material and either a filler material or none thereof may be subjected to the direct laser beam radiation without through any absorption film having a high absorptivity to the laser beam to cause a temperature raise of the laser beam exposed part of the organic insulation film thereby the local transformation or the local thermal decomposition is caused at the temperature raising part in the organic insulation film for subsequent ultra sonic cleaning process to form a fine definition via hole. In this case, it is not necessary to provide any absorption film having a high absorptivity to the laser beam on the organic insulation film. The laser beam is irradiated directly on the surface of the organic insulation film. This may permit a weak laser beam to cause the transformation or the thermal decomposition rather when the laser beam is irradiated on the absorption film on the organic insulation film.

The invention also provides a novel method of cutting an organic insulation film wherein predetermined parts of the organic insulation film are selectively exposed to a laser radiation to cause a thermal transformation or a thermal decomposition of the exposed parts thereof for subsequent ultrasonic cleaning of the film.

The laser beam is irradiated on a predetermined part of the organic insulation film to cause a transformation of the predetermined part of the organic insulation film or to cause a thermal decomposition thereof. Subsequently, the ultra sonic cleaning of the film is carried out to cut the organic insulation film. It is preferable that the insulation organic film to be cut has a high absorptivity to the laser beam. If the absorptivity of the organic insulation film is not so high, then it is preferable to provide an absorption film having a high absorptivity to the laser beam on the organic insulation film so that the laser beam is sufficiently absorbed by the absorption film to cause the transformation or the thermal decomposition of the predetermined part of the organic insulation film. The absorption film has a thickness of 0.1 micrometers. A weak laser beam radiation on the absorption film is carried out at a scanning speed of 1 cm/s to raise a temperature of the absorption film thereby the transformation or the thermal decomposition is caused at part of the organic insulation film under the exposed part of the absorption film. The organic insulation film is subjected to the ultra sonic cleaning to cause dispersions in a liquid of the base material of the organic insulation film and the filler material to thereby cut the organic insulation film.

Immediately after the laser beam radiation, the film was observed by an electron microscope so that it was confirmed that the absorption film is lost while the organic insulation film remains as a film with a homology being somewhat varied. As a result, it was appreciated that the laser beam radiation may render an atomic bonding weak between the base material and the filler material thereby the transformation or the thermal decomposition is caused in the organic insulation film wherein the transformed part thereof has a fine definition. The transformed part of the organic insulation film is subjected to the strong ultra sonic vibration to be dispersed to thereby cut the organic insulation film with a fine vertical cutting sections but without any flash or curvature.

If the organic insulation film has such an absorptivity that 20% or more of the laser beam may be absorbed in the organic insulation film, then the organic insulation film having the organic base material and either a filler material or none thereof may be subjected to the direct laser beam radiation without through any absorption film having a high absorptivity to the laser beam to cause a temperature raise of the laser beam exposed part of the organic insulation film thereby the local transformation or the local thermal decomposition is caused at the temperature raising part in the organic insulation film for subsequent ultra sonic cleaning process to form a fine definition trench groove thereby the organic insulation film is separated into a plurality of parts with the vertical fine cutting sections. In this case, it is not necessary to provide any absorption film having a high absorptivity to the laser beam on the organic insulation film. The laser beam is irradiated directly on the surface of the organic insulation film. This may permit a weak laser beam to cause the transformation or the thermal decomposition rather when the laser beam is irradiated on the absorption film on the organic insulation film.

The following descriptions will focus on preferred embodiments of the present invention.

A first embodiment according to the present invention will be described with reference to FIGS. 1A to 1C wherein a novel method of forming via holes in an organic insulation film is provided.

Figure 1A:
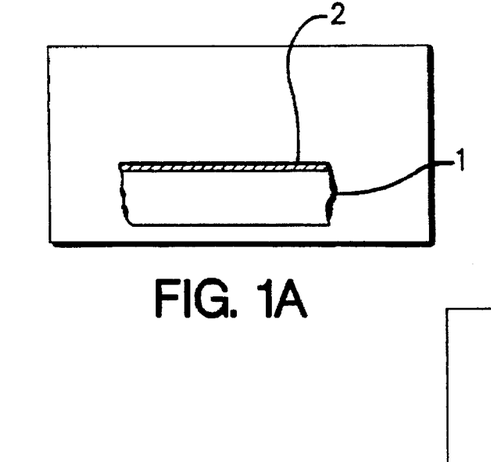
FIGS. 1A to 1C are cross sectional elevation views illustrative of an insulation organic film in sequential steps involved in a novel method of forming via holes in the organic insulation film according to a first embodiment according to the present invention.

With reference to FIG. 1A, a TEFLON® synthetic resin polymer film 1 is prepared so that a laser beam absorption film 2 having a high absorptivity to the laser beam is formed on an entire surface of the TEFLON® synthetic resin polymer film 1. The TEFLON® synthetic resin polymer film 1 has a thickness of 20 micrometers and includes silica glass fin particles as a filler material. The laser beam absorption film 2 comprises a gold thin film having a thickness of 300 angstroms wherein 300 angstroms is the absorption wavelength of Ar laser beam so that almost all of the Ar laser beam is absorbed by the gold thin absorption film having the 300 angstroms thickness except for a reflected part of the Ar laser beam by a surface of the gold film. The gold thin film 2 as the laser beam absorption film may be formed on the TEFLON® synthetic resin polymer film 1 by sputtering.

Figure 1B:
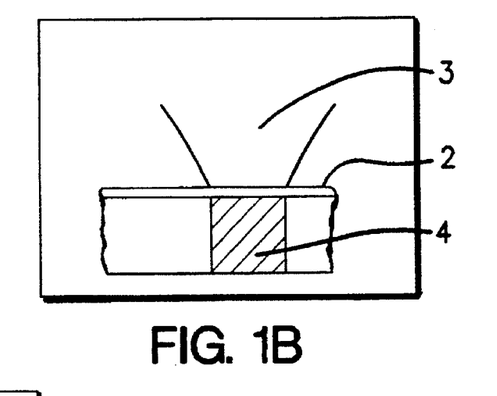

With reference to FIG. 1B, An Ar laser beam radiation apparatus is used. The laser beam radiation apparatus comprises an optical scanner for scanning of the Ar laser beam and a movable stage on which the TEFLON® synthetic resin polymer film is placed. The movable stage may move both in X and Y directions both of which are vertical to each other. The laser beam is generated by a laser source to be transmitted through a variable attenuator, an ultra sonic tuner, an optical scanner and a condenser lens so that a laser beam 3 having a laser intensity of 30 kW/cm$^2$ and a beam diameter of 8 micrometers defined by a value of 1/e$^2$ of beam intensity is irradiated on a surface of the gold laser beam absorption film 2. The optical scanner may show a scanning in an area of 5 cm×5 cm. The movable stage may permit an enlargement of the laser beam scanning area. At each point, the Ar laser beam is irradiated for 1 millisecond. The irradiation of the laser beam 3 may cause a transformation layer 4 in the Teflon film 1. By use of the above apparatus, 10000 via holes are formed in 10 cm square for 2 minutes only including alignment processes.

Figure 1C:
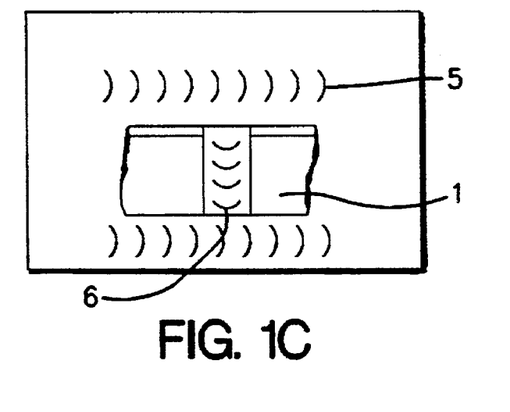
Figure 2:
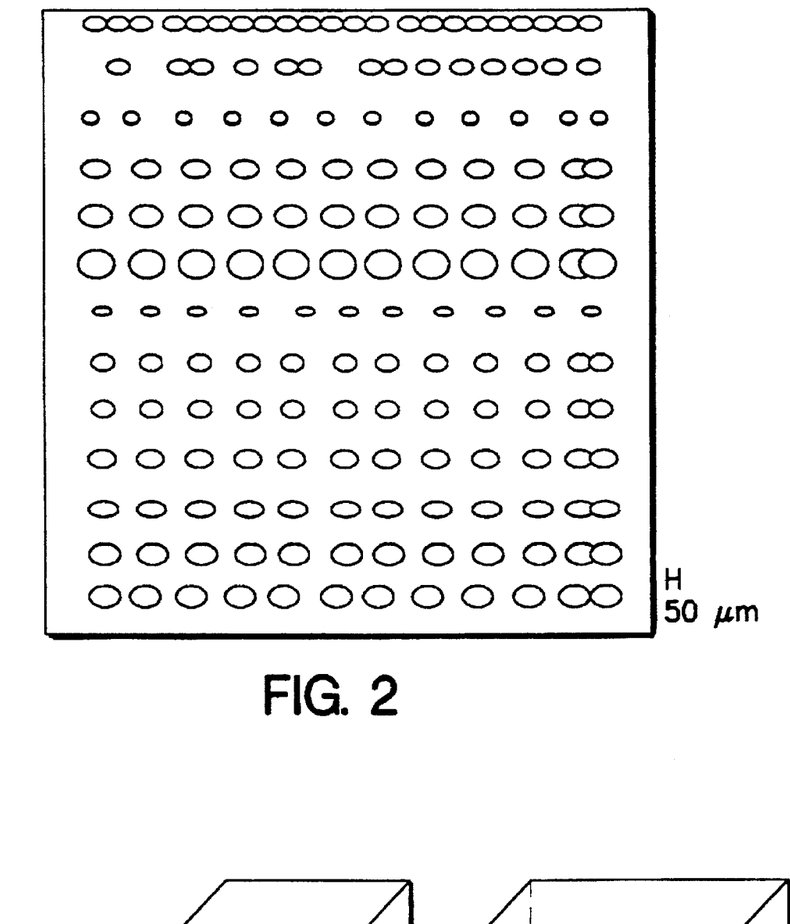
FIG. 2 is a plane view illustrative of an organic insulation film with via holes formed by a novel method of the present invention.

With reference to FIG. 1C, the TEFLON® synthetic resin polymer film is immersed into a water in an ultra sonic generator with an output of 100 W and a frequency 100 kHz so subsequent ultra sonic cleaning for 5 minutes. Ultra sonic wave 5 is propagated through the water in the ultra sonic generator onto the TEFLON® synthetic resin polymer film 1 with the transformation layer 4. As a result, the transformation layer 4 is dispersed into the water to form a via hole 6.

The via hole 6 formed in the TEFLON® synthetic resin polymer film 1 has a fine vertical edge defined by a diameter of 20 micrometers and a depth of 20 micrometers. The above novel method may permit a superior control of the definition of the via hole. Under the constant time for the laser beam radiation, the intensity of the laser beam results in the fact that the diameter of the via hole tends to be large. Namely, the control of the intensity of the laser beam with the constant time for the laser beam radiation may permit control of the diameter of the via hole.

It is available to vary the time for the laser beam radiation. If the intensity of the laser beam is increased up to 100 kW/cm$^2$, then the necessary time for the laser beam radiation at each point is reduced to 10 microseconds. If the intensity of the laser beam is reduced down to 10 kW/cm$^2$, then the necessary time for the laser beam radiation at each point is increased up to 100 milliseconds. The intensity and the time for the laser beam radiation are variable to match the conditions of the thickness of the film and the required throughput. The ultra sonic cleaning process may be carried out to subject a plurality of the TEFLON® synthetic resin polymer films 1 with the transformed layers 4 to the ultra sonic wave 5 for simultaneous processes of the plural TEFLON® synthetic resin polymer films 1 to improve the throughput.

Although in the foregoing embodiment the laser beam absorption film 2 comprises the gold film, other materials having a high absorptivity to the laser beam such as metal films, insulation films and semiconductor films as well as carbon based film are available. As the metal film, a titanium film, a nickel film and a copper film are available. As the insulation film, a titanium nitride film is available. As the semiconductor film, an alpha-silicon film is available. A vacuum evaporation method, a sputtering method and a chemical vapor deposition method are also available to deposit the laser beam absorption film on the TEFLON® synthetic resin polymer film 1. In place of the deposition of the absorption film, it is available that the TEFLON® synthetic resin polymer film is exposed to an etchant of sodium naphthalene to thereby form an absorption layer mainly comprising carbon and having a thickness of 0.1 micrometers. The absorption layer has a brown color.

In place of the Ar laser beam, Kr laser beam, Nd:YAG laser beam and second higher harmonic waves are available. Further, semiconductor lasers such as near infrared ray or visible rays are available. The use of the semiconductor laser may provide advantages such as a reduced cost, a small scale and a facilitation of tuning of a laser output. These advantages may further permit use of a plurality of the semiconductor lasers so that a plurality of via holes may be formed in a one time laser beam radiation to improve the throughput.

A second embodiment according to the present invention will be described with reference to FIGS. 3A to 3B in which another novel method for forming via holes in an organic insulation film having a relatively large absorptivity to a laser beam is provided.

The laser beam is irradiated directly on the organic insulation film without through any laser beam absorption film. The organic insulation film 7 includes a base material of a photosensitive epoxy resin and a filler material of a mixture of calcium carbonate, barium sulfate and glass particles. The organic insulation film 7 has a thickness of 70 micrometers. An Ar laser having a wavelength of 515 nanometers is used wherein ab absorption thickness is approximately 50 micrometers at which the intensity of the laser beam of 515 nanometers wavelength is reduced to 1/e.

Figure 3A:
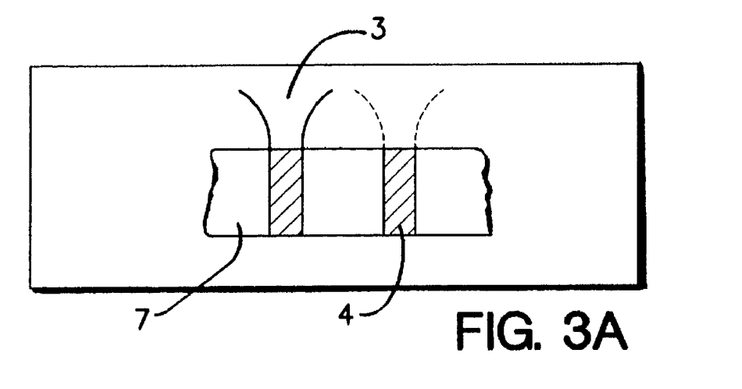
FIGS. 3A and 3B are cross sectional elevation views illustrative of an insulation organic film in sequential steps involved in a novel method of forming via holes in the organic insulation film according to a second embodiment of the present invention.

As illustrated in FIG. 3A, to form the transformed layer 4 in the insulation film 7, a laser beam radiation is carried out at a radiation power of 1 W for 6 milliseconds and at a beam diameter of 6 micrometers.

Figure 3B:
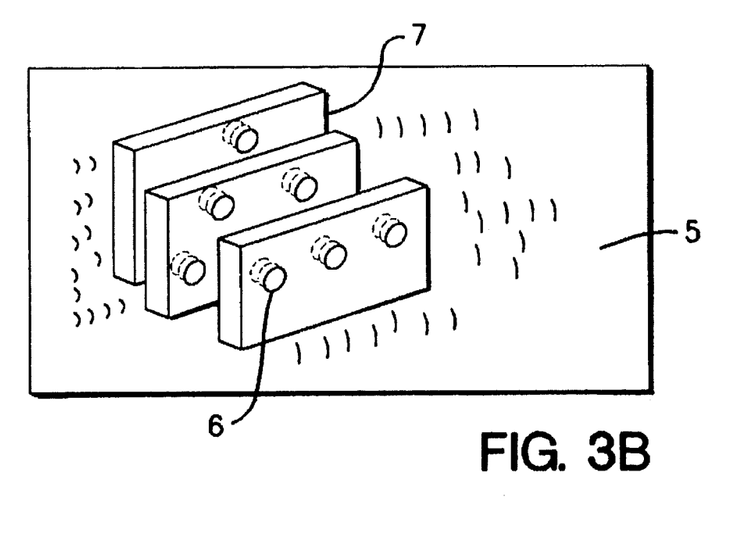

As illustrated in FIG. 3B, the ultra sonic cleaning process for the insulation film 7 with the transformed layer 4 is carried out at the same conditions as the first embodiment to thereby via holes are formed on the insulation film 7 wherein each via hole has a diameter of 10 micrometers and a depth of 70 micrometers as well as a fine vertical edge. The irradiation of the laser beam having a wavelength of the same as or near to the absorption wavelength of the insulation film may provide an advantage in a facility of forming a via hole with a large aspect ratio or the via hole having a large depth as compared to the diameter. The increase of the diameter of the via hole may be obtained by increase of any of the intensity of the laser beam, the time for the laser beam radiation and the laser beam diameter. If the laser beam intensity is increased up to 2 W but without any change of other conditions, then a via hole having a diameter of 80 micrometers is formed.

For irradiation of the laser beam having a wavelength of the same as or near to the absorption wavelength of the insulation film to form the via holes of the large aspect ratio, it is available to vary the laser beam wavelength, the base material of the film or to add the photosensitive material or a filler material with a high absorptivity to the laser beam.

In place of the Ar laser beam, Kr laser beam, Nd:YAG laser beam and second higher harmonic waves are available. Further, semiconductor lasers such as near infrared ray or visible rays are available. The use of the semiconductor laser may provide advantages such as a reduced cost, a small scale and a facilitation of tuning of a laser output. These advantages may further permit use of a plurality of the semiconductor lasers so that a plurality of via holes may be formed in a one time laser beam radiation to improve the throughput.

Although in the foregoing first and second embodiments, the base material of the insulation film comprises the TEFLON® synthetic resin polymer and the epoxy resin, it is available to use a polyimide resin is as a base material of the film and a silica or glass particles as a filler material. Further, it is available to use the TEFLON® synthetic resin polymer as a base material and a polyimide resin as a filler material. Is is also available to use either polyimide resin or an epoxy resin without any filler material. When no filler material is used, then a larger intensity by 30% of the laser beam is required as compared in use of the filler material so as to permit almost the same high quality as when the filler material is used. The insulation film comprising the TEFLON® synthetic resin polymer and silica particles has an excellent high frequency performance being suitable for a printed board as a CPU board of the computers. The insulation film comprising the polyimide resin and the silica particles is superior in a low cost and in a high heat resistivity. The insulation film comprising the epoxy resin and the glass particles is widely available with a low cost.

A third embodiment according to the present invention will be described with reference to FIGS. 1A to 1C wherein a novel method of cutting an organic insulation film is provided.

Figure 4A:
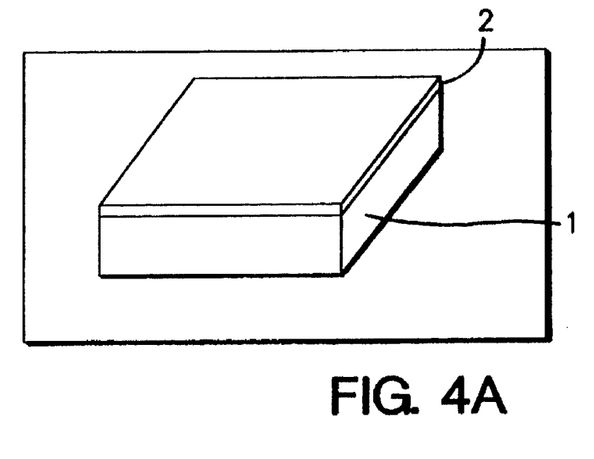
FIGS. 4A to 4C are cross sectional elevation views illustrative of an insulation organic film according to sequential steps involved in a novel method of cutting the film in a third embodiment of the present invention.

With reference to FIG. 4A, a TEFLON® synthetic resin polymer film 1 is prepared so that a laser beam absorption film 2 having a high absorptivity to the laser beam is formed on an entire surface of the Teflon film 1. The TEFLON® synthetic resin polymer film has a thickness of 20 micrometers and includes silica glass fin particles as a filler material. The laser beam absorption film 2 comprises a gold thin film having a thickness of 300 angstroms wherein 300 angstroms is the absorption wavelength of Ar laser beam so that almost all of the Ar laser beam is absorbed by the gold thin absorption film having the 300 angstroms thickness except for a reflected part of the Ar laser beam by a surface of the gold film. The gold thin film 2 as the laser beam absorption film may be formed on the TEFLON® synthetic resin polymer film 1 by sputtering.

Figure 4B:
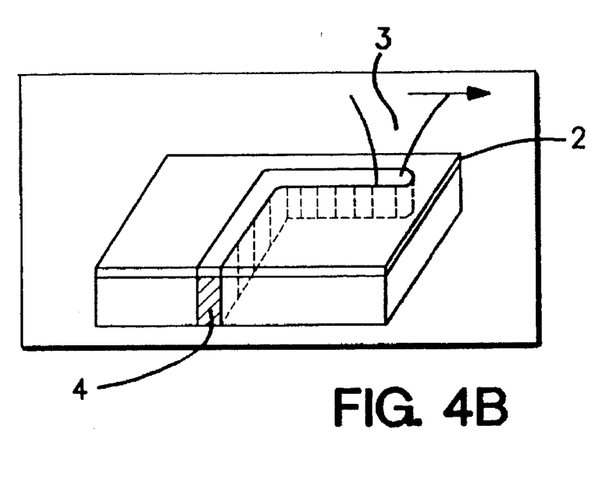

With reference to FIG. 4B, An Ar laser beam radiation apparatus is used. The laser beam radiation apparatus comprises an optical scanner for scanning of the Ar laser beam and a movable stage on which the TEFLON® synthetic resin polymer film is placed. The movable stage may move both in X and Y directions both of which are vertical to each other. The laser beam is generated by a laser source to be transmitted through a variable attenuator, an ultra sonic tuner, an optical scanner and a condenser lens so that a laser beam 3 having a laser intensity of 30 kW/cm$^2$ and a beam diameter of 8 micrometers defined by a value of 1/e$^2$ of beam intensity is irradiated on a surface of the gold laser beam absorption film 2. The optical scanner may show a scanning in an area of 5 cm×5 cm. The movable stage may permit an enlargement of the laser beam scanning area. At each point, the Ar laser beam is irradiated for 1 millisecond. The irradiation of the laser beam 3 may cause a transformation layer 4 in the TEFLON® synthetic resin polymer film 1. By use of the above apparatus, the TEFLON® synthetic resin polymer film is divided into 100 of 5 cm-squares for 100 seconds only including alignment processes.

Figure 4C:
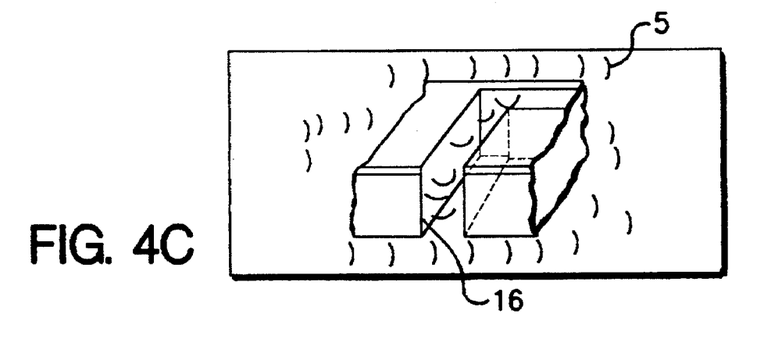
Figure 5:
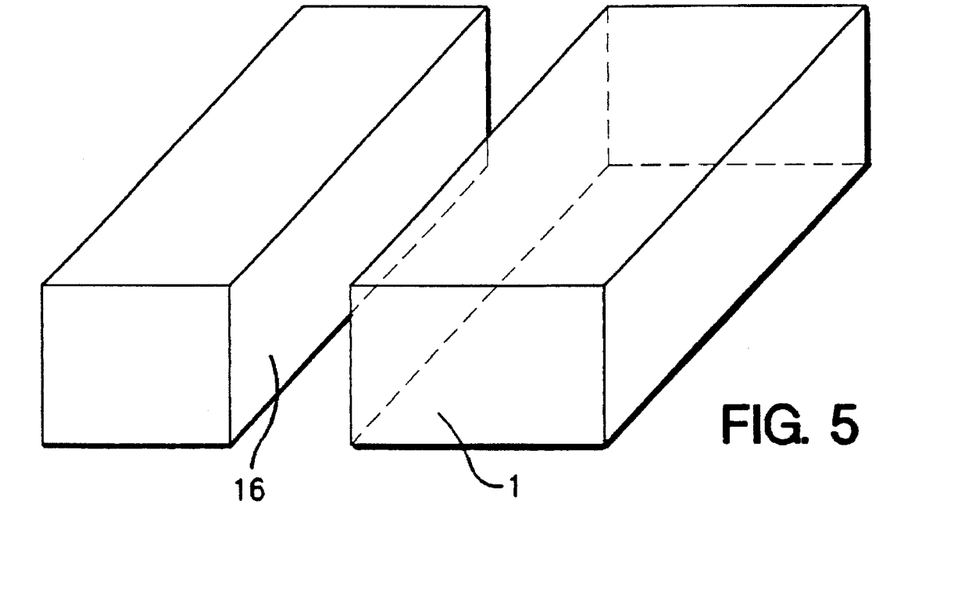
FIG. 5 is a schematic plane view illustrative of an organic insulation film with via holes formed by a novel method of the present invention.

With reference to FIG. 4C, the TEFLON® synthetic resin polymer film is immersed into a water in an ultra sonic generator with an output of 100 W and a frequency 100 kHz so subsequent ultra sonic cleaning for 5 minutes. Ultra sonic wave 5 is propagated through the water in the ultra sonic generator onto the TEFLON® synthetic resin polymer film 1 with the transformation layer 4. As a result, the transformation layer 4 is dispersed into the water to cur the film 1. The transformed layer has a width of 20 micrometers and a depth of 20 micrometers. The cut section 16 of the TEFLON® film 1 has a fine vertical edge free from any flash or any curvature as well as none of the transformed layer 4 remains on the cut edge of the film.

It is available to vary the time for the laser beam radiation. If the intensity of the laser beam is increased up to 100 kW/cm$^2$, then the necessary time for the laser beam radiation at each point is reduced to 10 microseconds. If the intensity of the laser beam is reduced down to 10 kW/cm$^2$, then the necessary time for the laser beam radiation at each point is increased up to 100 milliseconds. The intensity and the time for the laser beam radiation are variable to match the conditions of the thickness of the film and the required throughput. The ultra sonic cleaning process may be carried out to subject a plurality of the TEFLON® synthetic resin polymer films 1 with the transformed layers 4 to the ultra sonic wave 5 for simultaneous processes of the plural TEFLON® synthetic resin polymer films 1 to improve the throughput.

Although in the foregoing embodiment the laser beam absorption film 2 comprises the gold film, other materials having a high absorptivity to the laser beam such as metal films, insulation films and semiconductor films as well as carbon based film are available. As the metal film, a titanium film, a nickel film and a copper film are available. As the insulation film, a titanium nitride film is available. As the semiconductor film, an alpha-silicon film is available. A vacuum evaporation method, a sputtering method and a chemical vapor deposition method are also available to deposit the laser beam absorption film on the TEFLON® synthetic resin polymer film 1. In place of the deposition of the absorption film, it is available that the TEFLON® synthetic resin polymer film is exposed to an etchant of sodium naphthalene to thereby form an absorption layer mainly comprising carbon and having a thickness of 0.1 micrometers. The absorption layer has a brown color.

In place of the Ar laser beam, Kr laser beam, Nd:YAG laser beam and second higher harmonic waves are available. Further, semiconductor lasers such as near infrared ray or visible rays are available. The use of the semiconductor laser may provide advantages such as a reduced cost, a small scale and a facilitation of tuning of a laser output. These advantages may further permit use of a plurality of the semiconductor lasers so that the cutting of the film is obtained by a one time laser beam radiation to improve the throughput.

A fourth embodiment according to the present invention will be described with reference to FIGS. 6A to 6B in which another novel method for cutting an organic insulation film having a relatively large absorptivity to a laser beam is provided.

The laser beam is irradiated directly on the organic insulation film without through any laser beam absorption film. The organic insulation film 7 includes a base material of a photosensitive epoxy resin and a filler material of a mixture of calcium carbonate, barium sulfate and glass particles. The organic insulation film 7 has a thickness of 70 micrometers. An Ar laser having a wavelength of 515 nanometers is used wherein ab absorption thickness is approximately 50 micrometers at which the intensity of the laser beam of 515 nanometers wavelength is reduced to $1/e$.

Figure 6A:
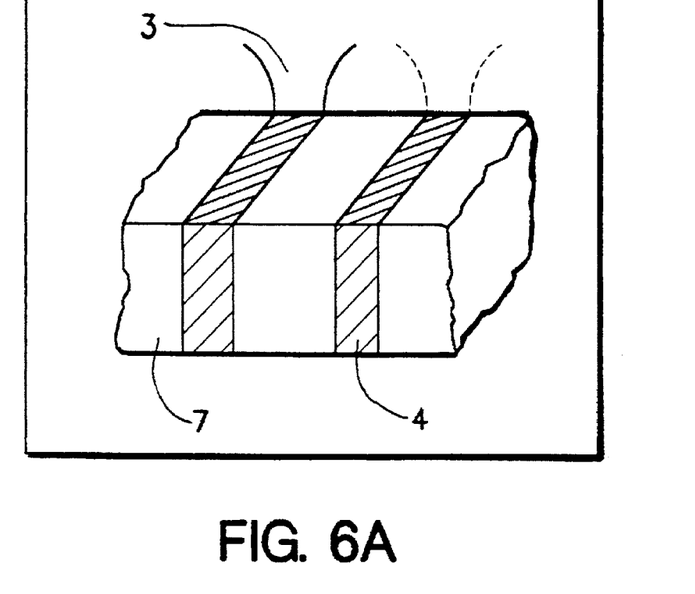
FIGS. 6A and 6B are cross sectional elevation views illustrative of an insulation organic film in sequential steps involved in a novel method of cutting the organic insulation film according to a fourth embodiment of the present invention.

As illustrated in FIG. 6A, to form the transformed layer 4 in the insulation film 7, a laser beam radiation is carried out at a radiation power of 1 W for 6 milliseconds and at a beam diameter of 6 micrometers.

Figure 6B:
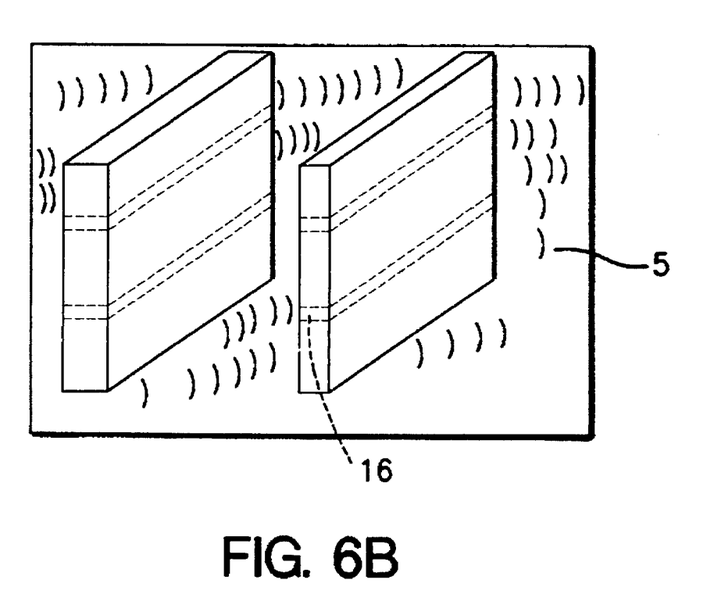

As illustrated in FIG. 6B, the ultra sonic cleaning process for the insulation film 7 with the transformed layer 4 is carried out at the same conditions as the third embodiment to thereby the insulation film 7 is cut wherein the cut section 16 has a cutting width of 20 micrometers and a depth of 70 micrometers as well as a fine vertical edge. The irradiation of the laser beam having a wavelength of the same as or near to the absorption wavelength of the insulation film may provide an advantage in a facility of cutting of the film with a large aspect ratio or the cutting section 16 having a large depth as compared to the cutting width. The increase of the cutting width of the cutting section 16 may be obtained by increase of any of the intensity of the laser beam, the time for the laser beam radiation and the laser beam diameter.

For irradiation of the laser beam having a wavelength of the same as or near to the absorption wavelength of the insulation film to cut the film with the large aspect ratio, it is available to vary the laser beam wavelength, the base material of the film or to add the photosensitive material or a filler material with a high absorptivity to the laser beam.

In place of the Ar laser beam, Kr laser beam, Nd:YAG laser beam and second higher harmonic waves are available. Further, semiconductor lasers such as near infrared ray or visible rays are available. The use of the semiconductor laser may provide advantages such as a reduced cost, a small scale and a facilitation of tuning of a laser output. These advantages may further permit use of a plurality of the semiconductor lasers so that the organic insulation film is cut in a one time laser beam radiation to improve the throughput.

Although in the foregoing third and fourth embodiments, the base material of the insulation film comprises the TEFLON® synthetic resin polymer and the epoxy resin, it is available to use a polyimide resin is as a base material of the film and a silica or glass particles as a filler material. Further, it is available to use the TEFLON® synthetic resin polymer as a base material and a polyimide resin as a filler material. Is is also available to use either polyimide resin or an epoxy resin without any filler material. When no filler material is used then a larger intensity by 30% of the laser beam is required as compared in use of the filler material so as to permit almost the same high quality as when the filler material is used. The insulation film comprising the TEFLON® synthetic resin polymer and silica particles has an excellent high frequency performance being suitable for a printed board as a CPU board of the computers. The insulation film comprising the polyimide resin and the silica particles is superior in a low cost and in a high heat resistivity. The insulation film comprising the epoxy resin and the glass particles is widely available at low cost.

Whereas modifications of the present invention will no doubt be apparent to a person having ordinary skill in the art to which the invention pertains, it is to be understood that embodiments shown and described by way of illustrations are by no means intended to be considered in a limiting sense. Accordingly, it is to be intended to cover by claims all modifications of the present invention which fall within the spirit and scope of the invention.

What is claimed is:

1. A method of forming via holes in an organic insulation film comprising the steps of:

exposing predetermined parts of said film to a laser beam to raise a temperature of said exposed parts of said film until said exposed parts are transformed or decomposed;

subjecting said film to an ultra sonic wave so that said transformed or decomposed parts are dispersed to form via holes.; and forming a layer having a high absorptivity to a laser beam by subjecting said film to a liquid including sodium naphthalene.

2. The method as claimed in claim 1, wherein said laser beam is a visible ray or a near infrared ray.

3. The method as claimed in claim 1, wherein said laser beam has an absorption wavelength of the film.

4. The method as claimed in claim 1, wherein said film comprises a base material of a synthetic resin polymer and a filler material of glass particles.

5. The method as claimed in claim 1, wherein said film comprises a polyimide resin.

6. The method as claimed in claim 1, wherein said film comprises an epoxy resin.

7. The method as claimed in claim 1, wherein said film comprises a base material of an epoxy resin and a filler material of insulation compound particles.

8. The method as claimed in claim 1, wherein said film comprises a base material of a polyimide resin and a filler material of insulation compound particles.

9. The method as claimed in claim 1, wherein said film comprises a base material of a synthetic resin polymer and a filler material of insulation compound particles.

10. A method of cutting an organic insulation film comprising the steps of:

exposing predetermined parts of said film to a laser beam to raise a temperature of said exposed parts of said film until said exposed parts are transformed or decomposed;

subjecting said film to an ultra sonic wave so that said transformed or decomposed parts are dispersed to cut said film; and forming a layer having a high absorptivity to a laser beam by subjecting said film to a liquid including sodium naphthalene.

11. The method as claimed in claim 10, wherein said laser beam is a visible ray or a near infrared ray.

12. The method as claimed in claim 10, wherein said laser beam has an absorption wavelength of the film.

13. The method as claimed in claim 10, wherein said film comprises a base material of a synthetic resin polymer and a filler material of glass particles.

14. The method as claimed in claim 10, wherein said film comprises a polyimide resin.

15. The method as claimed in claim 10, wherein said film comprises an epoxy resin.

16. The method as claimed in claim 10, wherein said film comprises a base material of an epoxy resin and a filler material of insulation compound particles.

17. The method as claimed in claim 10, wherein said film comprises a base material of a polyimide resin and a filler material of insulation compound particles.

18. The method as claimed in claim 10, wherein said film comprises a base material of a synthetic resin polymer and a filler material of insulation compound particles.

19. A method of forming via holes in an organic insulation film comprising the steps of:

exposing predetermined parts of said film to a laser beam to raise a temperature of said exposed parts of said film until said exposed parts are transformed or decomposed, said film being formed of a base material—filler material pair, said pair being selected from the group consisting of: a base material of synthetic resin polymer and a filler material of glass particles, a base material of an epoxy resin and a filler material of insulation compound particles, a base material of a polyamide resin and a filler material of insulation compound particles and a base material of synthetic resin polymer and a filler material of insulation compound particles; and subjecting said film to an ultrasonic wave so that said transformed or decomposed parts are dispersed to form via holes.

20. The method as claimed in claim 19, wherein said laser beam is a visible ray or a near infrared ray.

21. The method as claimed in claim 19, further comprising the step of forming a layer having a high absorptivity to a laser beam.

22. The method as claimed in claim 19, wherein said layer is formed by sputtering.

23. The method as claimed in claim 19, wherein said layer is formed by evaporation.

24. The method as claimed in claim 19, wherein said layer is formed by a chemical vapor deposition.

25. The method as claimed in claim 21, wherein said layer is formed by subjecting said film to a liquid including sodium naphthalene.

26. The method as claimed in claim 19, wherein said laser beam has an absorption wavelength of the film.

27. The method as claimed in claim 19, wherein said film comprises a polyamide resin.

28. The method as claimed in claim 19, wherein said film comprises an epoxy resin.

29. A method of cutting an organic insulation film comprising the steps of:

exposing predetermined parts of said film to a laser beam to raise a temperature of said exposed parts of said film until said exposed parts are transformed or decomposed, said film being formed of a base material—filler material pair, said pair selected from the group consisting of: a base material of synthetic resin polymer and a filler material of glass particles, a base material of an epoxy resin and a filler material of insulation compound particles, a base material of a polyamide resin and a filler material of insulation compound particles, and a base material of synthetic resin polymer and a filler material of insulation compound particles; and subjecting said film to an ultrasonic wave so that said transformed or decomposed parts are dispersed to cut said film.

30. The method as claimed in claim 29, wherein said laser beam is a visible ray or a near infrared ray.

31. The method as claimed in claim 29, further comprising the step of forming a layer having a high absorptivity to a laser beam.

32. The method as claimed in claim 29, wherein said layer is formed by sputtering.

33. The method as claimed in claim 29, wherein said layer is formed by evaporation.

34. The method as claimed in claim 29, wherein said layer is formed by a chemical vapor deposition.

35. The method as claimed in claim 29, wherein said layer is formed by subjecting said film to a liquid including sodium naphthalene.

36. The method as claimed in claim 29, wherein said laser beam has an absorption wavelength of the film.

37. The method as claimed in claim 29, wherein said film comprises a polyamide resin.

38. The method as claimed in claim 29, wherein said film comprises an epoxy resin.

* * * * *